United States Patent
Kim

(10) Patent No.: US 10,529,491 B1
(45) Date of Patent: Jan. 7, 2020

(54) MULTILAYER CERAMIC ELECTRONIC COMPONENT

(71) Applicant: SAMSUNG ELECTRO-MECHANICS CO., LTD., Suwon-si, Gyeonggi-do (KR)

(72) Inventor: Min Hyang Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/274,777

(22) Filed: Feb. 13, 2019

(30) Foreign Application Priority Data

Nov. 16, 2018 (KR) .................. 10-2018-0141419

(51) Int. Cl.
| | |
|---|---|
| *H01G 4/30* | (2006.01) |
| *H01G 4/232* | (2006.01) |
| *H05K 1/18* | (2006.01) |
| *H01G 2/06* | (2006.01) |
| *H01G 4/12* | (2006.01) |

(52) U.S. Cl.
CPC .............. *H01G 4/30* (2013.01); *H01G 2/065* (2013.01); *H01G 4/232* (2013.01); *H05K 1/181* (2013.01); *H01G 4/1227* (2013.01); *H05K 2201/10015* (2013.01)

(58) Field of Classification Search
CPC ................................ H01G 4/30; H01G 4/232
See application file for complete search history.

(56) References Cited

U.S. PATENT DOCUMENTS

2008/0130198 A1*  6/2008  Nakano ................. H01G 4/012
                                                                   361/303
2015/0077898 A1    3/2015  Chung et al.

FOREIGN PATENT DOCUMENTS

| JP | 2000-182879 A |   | 6/2000 |            |
|----|---------------|---|--------|------------|
| JP | 2006310700 A  | * | 11/2006 |            |
| JP | 2008071926 A  | * | 3/2008 | ........... H01G 4/2325 |
| KR | 10-2015-0031908 A |   | 3/2015 |            |

* cited by examiner

*Primary Examiner* — Eric W Thomas
(74) *Attorney, Agent, or Firm* — Morgan, Lewis & Bockius LLP

(57) ABSTRACT

A multilayer ceramic electronic component includes a ceramic body having at least one rounded corner, and including dielectric layers and first and second internal electrodes laminated with respective dielectric layers interposed therebetween, and first and second external electrodes, electrically connected to corresponding internal electrodes, respectively. The first and second external electrodes include first and second base electrode layers, each having at least a portion in contact with first and second external surfaces of the ceramic body, first and second conductive resin layers disposed to cover the first and second base electrode layers, respectively, and first and second plating layers disposed to cover the first and second conductive resin layers, respectively.

6 Claims, 8 Drawing Sheets

MULTILAYER CERAMIC ELECTRONIC COMPONENT

CROSS-REFERENCE TO RELATED APPLICATION(S)

This application claims benefit of priority to Korean Patent Application No. 10-2018-0141419 filed on Nov. 16, 2018 in the Korean Intellectual Property Office, the disclosure of which is incorporated herein by reference in its entirety.

TECHNICAL FIELD

The present disclosure relates to a multilayer ceramic electronic component.

BACKGROUND

Multilayer ceramic electronic components are widely used as IT components in computers, PDAs, mobile phones, and the like due to advantages thereof such as compactness, high capacitance, and ease of mountability. Also, such multilayer ceramic electronic components are widely used as electric components due to high reliability and high strength characteristics thereof.

Recently, multilayer ceramic electronic components have become smaller due to the miniaturization/thinning of IT products. Accordingly, strengths (for example, flexural strength, tensile strength, fixing strength, and the like) of multilayer ceramic electronic components have become increasingly important.

SUMMARY

An aspect of the present disclosure is to provide a multilayer ceramic electronic component having improved reliability (for example, prevention of humidity/plating liquid permeation, external impact absorption performance, prevention of external electrode faulty, and the like) of a rounded corner of a ceramic body while having improved strength.

According to an aspect of the present disclosure, a multilayer ceramic electronic component includes a ceramic body having at least one rounded corner, and including dielectric layers and first and second internal electrodes laminated with respective dielectric layers interposed therebetween to be exposed to a first external surface and a second external surface of the ceramic body, and first and second external electrodes, disposed on external surfaces of the ceramic body and electrically connected to corresponding internal electrodes among the first and second internal electrodes, respectively, extending to a surface of the ceramic body in a thickness direction. The first and second external electrodes include first and second base electrode layers, each having at least a portion in contact with first and second external surfaces of the ceramic body, first and second conductive resin layers covering the first and second base electrode layers, respectively, and first and second plating layers covering the first and second conductive resin layers, respectively. An average of respective longest lengths of the first and second conductive resin layers in a length direction is denoted by BWb, a radius of the rounded corner is denoted by RC, and BWb/RC is 4 or more to 22 or less.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
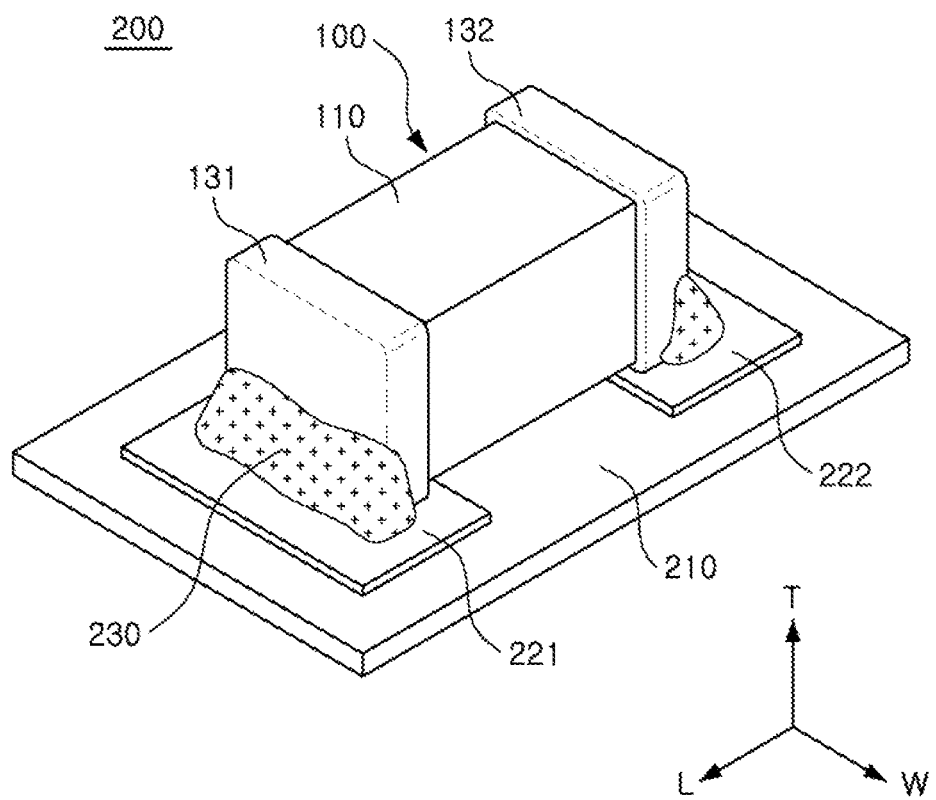
FIG. 1 is a perspective view illustrating a multilayer ceramic electronic component and a mounting form thereof according to an exemplary embodiment in the present disclosure.

Hereinafter, embodiments of the present disclosure will be described as follows with reference to the attached drawings. The present disclosure may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Through the specification, in addition, unless explicitly described to the contrary, the word "comprise" and variations such as "comprises" or "comprising," will be understood to imply the inclusion of stated elements but not the exclusion of any other elements.

Directions of a hexahedral ceramic body will be defined in order to clearly describe an embodiment of the invention. L, W and T shown throughout the drawings refer to a length direction, a width direction, and a thickness direction, respectively. Here, the thickness direction may be the same as a direction in which dielectric layers are laminated.

Hereinafter, a multilayer ceramic electronic component according to an exemplary embodiment in the present disclosure will be described. In detail, a multilayer ceramic capacitor will be described. However, the present disclosure is not limited thereto.

FIG. 1 is a perspective view illustrating a multilayer ceramic electronic component and a mounting from thereof according to an exemplary embodiment in the present disclosure.

Referring to FIG. 1, a multilayer ceramic electronic component 100 may include a ceramic body 110 and first and second external electrodes 131 and 132, and may be mounted (200) on first and second electrode pads 221 and 222 on a board 210.

The ceramic body 110 may be formed as a hexahedron having two side surfaces in a length direction L, two side surfaces in a width direction W, and two side surfaces in a thickness direction T. The ceramic body 110 may be formed by laminating a plurality of dielectric layers 111 (shown in FIG. 3) in the thickness direction T and then sintering the plurality of dielectric layers 111. Shapes and dimensions of the ceramic body 110 and the number of laminated dielectric layers 111 (one or more) are not limited to those of an example illustrated in the exemplary embodiment.

The plurality of dielectric layers 111 disposed in the ceramic body 110 may be in a sintered state, and adjacent dielectric layers 111 may be integrated with each other so that boundaries therebetween are not readily apparent without using a scanning electron microscope (SEM).

A thickness of the dielectric layer 111 may be arbitrarily changed in accordance with a capacitance design of the multilayer ceramic electronic component 100, and the dielectric layer 111 may contain ceramic powder particles having a high dielectric constant, such as barium titanate ($BaTiO_3$)-based powder particles or strontium titanate (Sr-$TiO_3$)-based powder particles. However, a material thereof is not limited thereto. Further, various ceramic additives, organic solvents, plasticizers, binders, dispersing agents, and the like, may be added to the ceramic powder particles, according to the object of the present disclosure.

An average particle size of a ceramic powder used to form the dielectric layer 111 is not limited and may be controlled to achieve the object of the present disclosure. For example, the average particle size may be controlled to be 400 nanometers (nm) or less. Accordingly, the multilayer ceramic electronic component 100 according to an exemplary embodiment may be used as a component requiring a large size and high capacitance as in the case of IT components.

For example, the dielectric layer 111 may be formed by applying slurry containing a powder such as a barium titanate ($BaTiO_3$)-based powder to carrier films and drying the applied slurry to prepare a plurality of ceramic sheets. The ceramic sheet may be manufactured by mixing the ceramic powder, a binder, and a solvent to prepare the slurry and manufacturing the prepared slurry in a sheet shape having a thickness of several micrometers ($\mu m$) by a doctor blade method, but the manufacturing method of the ceramic sheet is not limited thereto.

The first and second external electrodes 131 and 132 may be disposed on first and second external surfaces (for example, one external surface and the other external surfaces in the length direction) of the ceramic body 110 to be connected to first and second internal electrodes, respectively. Also the first and second external electrodes 131 and 132 may be configured to electrically connect the first and second internal electrodes to a board.

For example, the first and second external electrodes 131 and 132 may be formed of one of copper (Cu), palladium (Pd), platinum (Pt), gold (Au), silver (Ag), and lead (Pb), or alloys thereof.

The first and second external electrodes 131 and 132 may be electrically connected to the first and second electrode pads 221 and 222 through first and second solders 230, respectively. For example, the first and second solders 230 may be more closely connected to the first and second external electrodes 131 and 132 according to a reflow process.

Figure 2:
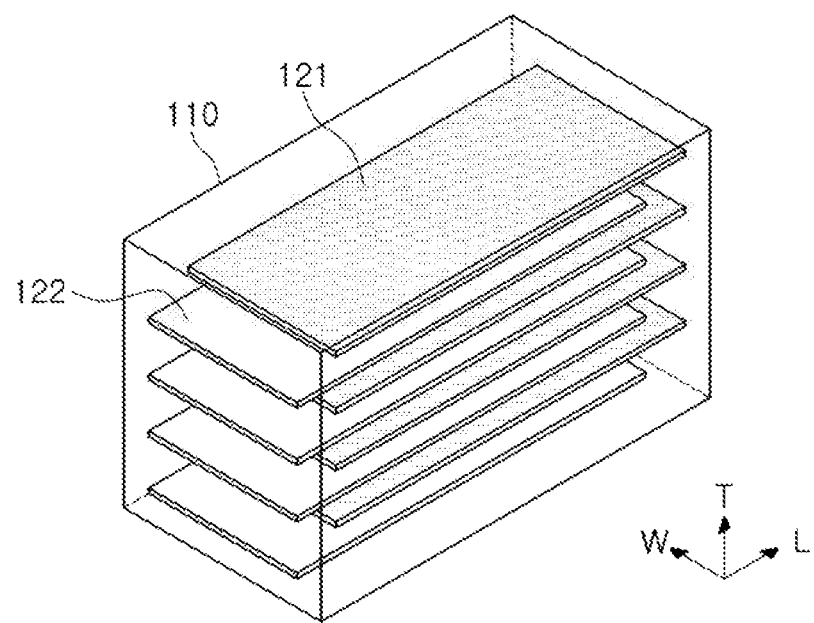
FIG. 2 is a perspective view illustrating a shape of an internal electrode of a multilayer ceramic electronic component according to an exemplary embodiment in the present disclosure.

FIG. 2 is a perspective view illustrating a shape of an internal electrode of a multilayer ceramic electronic component according to an exemplary embodiment in the present disclosure.

Referring to FIG. 2, a ceramic body includes first and second internal electrodes 121 and 122, and a plurality of dielectric layers. The first and second internal electrodes 121 and 122 are alternately laminated with respective dielectric layers disposed therebetween to be exposed to a first external surface and a second external surface of the ceramic body 110 (for example, one external surface and the other external surface of the ceramic body 110 in the length direction) to have polarities opposite to each other.

The first internal electrodes 121 and the second internal electrodes 122 may be formed in a laminating direction of the dielectric layers to be alternately exposed to one external surface and the other external surface of the ceramic body 110 in the length direction L of the ceramic body 110 by printing a conductive paste containing a conductive metal thereon. The first internal electrodes 121 and the second internal electrodes 122 may be electrically insulated from each other by respective dielectric layers disposed therebetween.

For example, the first and second internal electrodes 121 and 122 may be electrically connected to the first and second external electrodes 131 and 132 disposed on both external surfaces of the ceramic body 110 in the length direction L of the ceramic body 110 through portions alternately exposed to both external surfaces of the ceramic body 110 in the length direction L of the ceramic body 110, respectively.

For example, the first and second internal electrodes 121 and 122 may be formed of a conductive paste for an internal electrode having an average particle size of 0.1 to 0.2 $\mu m$ and containing 40 wt % to 50 wt % of conductive metal powder particles, but the conductive paste thereof is not limited thereto.

The conductive paste for an internal electrode may be applied to the ceramic sheets by a printing method, or the like, to form internal electrode patterns. A method of printing the conductive paste may be a screen printing method, a gravure printing method, or the like, but is not limited thereto. Two hundred or three hundred ceramic sheets on which the internal electrode pattern is printed may be laminated, pressed, and sintered to manufacture the ceramic body 110.

Accordingly, when a voltage is applied to the first and second external electrodes 131 and 132 opposing each other, charges are accumulated between the first and second internal electrodes 121 and 122. In this case, capacitance of the multilayer ceramic electronic component 100 is in proportion to an area of a region in which the first and second internal electrodes 121 and 122 overlap each other.

For example, when the overlapping area of the first and second internal electrodes 121 and 122 is significantly increased, capacitance of a capacitor having the same size may be significantly increased.

Each of the thicknesses of the first and second internal electrodes 121 and 122 may be 0.4 $\mu m$ or less. In addition, the number of the first and second internal electrodes 121 and 122 laminated may be 400 or more. Thus, the multilayer ceramic electronic component 100 may be used as an IT component requiring compactness and high capacitance. The thickness of the first and second internal electrodes 121 and the number of the first and second internal electrodes 121 and 122 are not limited thereto.

Since a thickness of a dielectric layer corresponds to a distance between the first and second internal electrodes 121 and 122, the capacitance of the multilayer ceramic electronic component 100 may be increased as the thickness of the dielectric layer is decreased.

The first and second internal electrodes 121 and 122 may be formed of one of nickel (Ni), copper (Cu), palladium (Pd), silver (Ag), lead (Pb), and platinum (Pt), or alloys thereof, but a material thereof is not limited thereto.

Withstand voltage characteristics of the ceramic body 110 may be improved as the distance between the first and second internal electrodes 121 and 122 is increased.

In the case in which the multilayer ceramic electronic component 100 is required to have withstand voltage characteristics that are as high as those of an electric component, the multilayer ceramic electronic component 100 may be designed in such a manner that an average thickness of dielectric layers may exceed twice an average thickness of the first and second internal electrodes 121 and 122. Accordingly, the multilayer ceramic electronic component 100 may have high withstand voltage characteristics to be used as an electric component.

Durability (for example, flexural strength) of the ceramic body 110 may have improved reliability when a width of the ceramic body exceeds 0.5 times a thickness thereof.

Figure 3A:
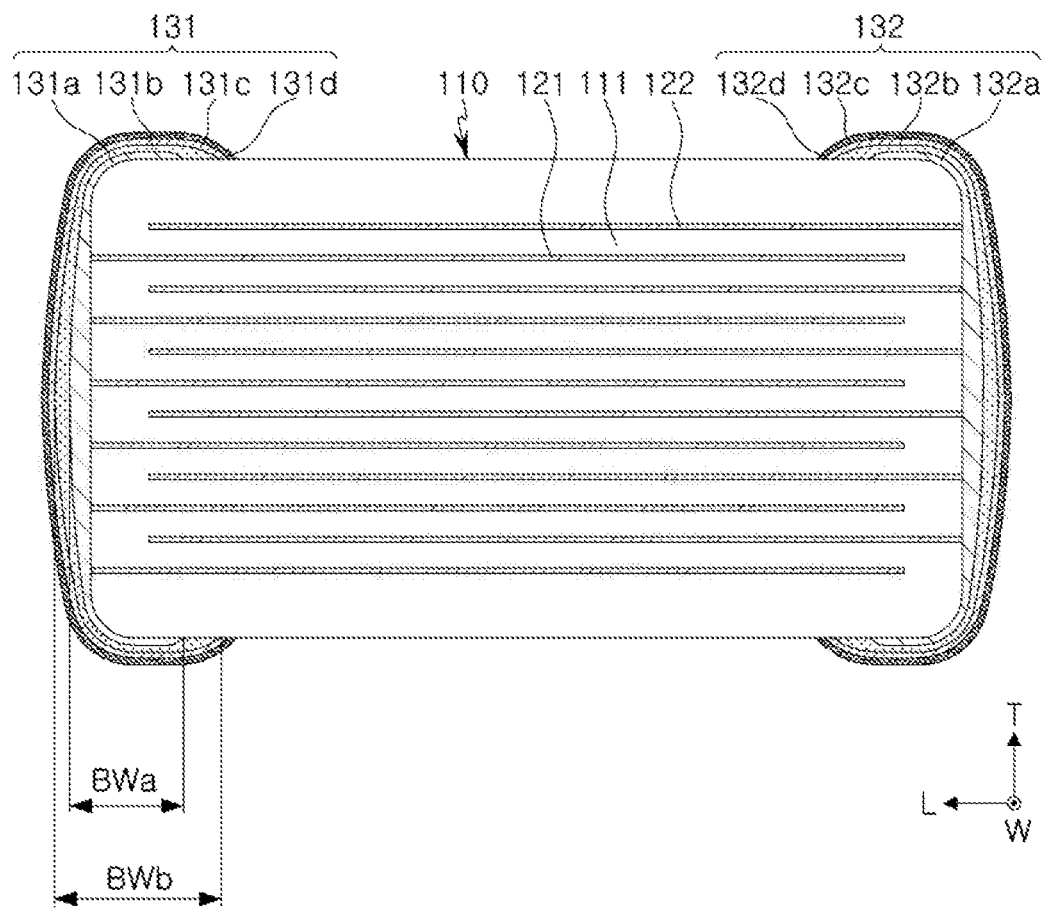
FIG. 3A is a cross-sectional view illustrating a side surface of a multilayer ceramic electronic component according to an exemplary embodiment in the present disclosure.
Figure 3B:
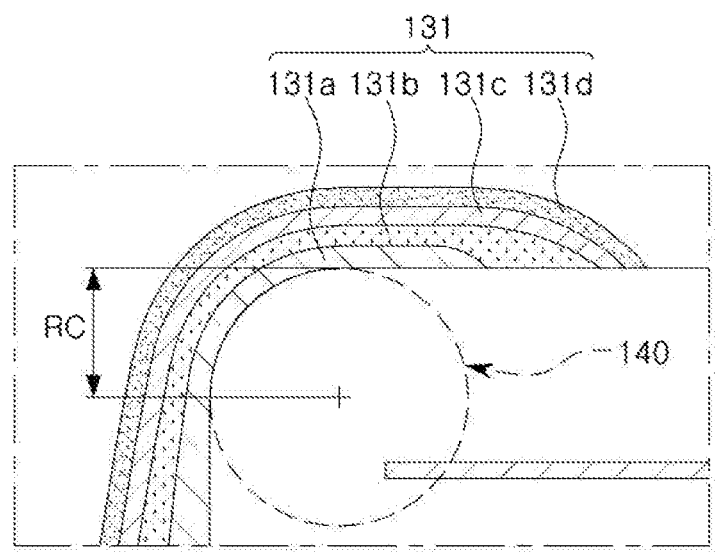
FIG. 3B is a cross-sectional view illustrating a corner of a multilayer ceramic electronic component according to an exemplary embodiment in the present disclosure.

FIG. 3A is a cross-sectional view illustrating a side surface of a multilayer ceramic electronic component according to an exemplary embodiment in the present disclosure, and FIG. 3B is a cross-sectional view illustrating a corner of a multilayer ceramic electronic component according to an exemplary embodiment in the present disclosure.

Referring to FIG. 3A, first and second external electrodes 131 and 132 may include first and second base electrode layers 131*a* and 132, each having at least a portion in contact with first and second external surfaces (for example, one external surface and the other external surface of the ceramic body 110 in a length direction), first and second conductive resin layers 131*b* and 132*b* disposed to cover the first and second base electrode layers 131*a* and 132*a*, and first and second plating layers 131*c* and 132*c* disposed to cover the first and second conductive resin layers 131*b* and 132*b*, respectively.

For example, the first and second base electrode layers 131*a* and 132*a* may contain mainly the same metal component as a metal component (for example, copper (Cu), nickel (Ni), or the like) contained most in the internal electrodes 121 and 122 and may be formed using sintering. Accordingly, since the first and second base electrode layers 131*a* and 132*a* may be relatively easily bonded to the first and second internal electrodes 121 and 122, currents of the first and second internal electrodes 121 and 122 may be collected efficiently (for example, low contact resistance).

The first and second base electrode layers 131*a* and 132*a* may be formed by dipping into a paste containing a metal component or printing a conductive paste containing a conductive metal on at least one surface of the ceramic body in a thickness direction T. Alternatively, the first and second base electrode layers 131*a* and 132*a* may be formed by a sheet transfer method or a pad transfer method, but a forming method thereof is not limited thereto.

Since the first and second conductive resin layers 131*b* and 132*b* may have higher flexibility than the first and second plating layers 131*c* and 132*c*, they may protect the multilayer ceramic electronic component 100 from an external physical impact or a bending impact of the multilayer ceramic electronic component 100. In addition, the first and second conductive resin layers 131*b* and 132*b* may absorb tensile stress or stress applied during board mounting to prevent cracking from occurring in an external electrode.

For example, the first and second conductive resin layers 131*b* and 132*b* may have a structure, in which a conductive particle such as copper (Cu), nickel (Ni), palladium (Pd), platinum (Pt), gold (Au), silver (Ag), lead (Pb), or the like is contained in a glass or a highly-flexible resin such as epoxy, to have high flexibility and high conductivity.

The first and second plating layers 131*c* and 132*c* may improve at least some of structural reliability, ease of board mounting, resistance to the outside, heat resistance, and equivalent series resistance (ESR), and may be formed using sputtering or electric deposition, but a forming method thereof is not limited thereto.

The first and second external electrodes 131 and 132 may include third and fourth plating layers 131*d* and 132*d* disposed to cover the first and second plating layers 131*c* and 132*c*, respectively. The third and fourth plating layers 131*d* and 132*d* may contain the most tin (Sn), and the first and second plating layers 131*c* and 132*c* may contain the most nickel (Ni). In the case in which the third and fourth plating layers 131*d* and 132*d* are included in the first and second external electrodes 131 and 132, the first and second plating layers 131*c* and 132*c* may be omitted depending on a design.

Referring to FIG. 3B, a ceramic body 110 may have a hexahedral shape having at least one rounded corner 140. Accordingly, durability and reliability of the ceramic body 110 may be improved, and structural reliability of the first and second external electrodes 131 and 132 on a corner may be improved.

The rounded corner 140 may disperse stress, applied to the ceramic body 110, concentrated on a vertex. Cracking may occur in the ceramic body 110. Since the cracking may start from a point on which the stress is concentrated, a frequency of cracking occurring in the ceramic body 110 may be reduced as the stress is dispersed, and thus the ceramic body 110 may have improved strength.

For example, a radius RC of the rounded corner 140 may be adjusted by controlling polishing time during a polishing process.

Since the rounded corner 140 may further disperse the stress as the radius RC increases, the ceramic body 110 may have further improved strength.

The radius RC of the rounded corner 140 may affect thicknesses of the first and second resin layer 131*b* and 132*b*, disposed to cover the rounded corner 140, on the rounded corner 140.

When the radius RC of the rounded corner 140 is significantly greater than the overall thickness of the first and second conductive resin layers 131*b* and 132*b*, the first and second conductive resin layers 131*b* and 132*b* may be discontinued on the rounded corner 140. In the case in which the first and second conductive resin layers 131*b* and 132*b* are discontinued, the rounded corner 140 may be a permeation path of humidity and plating liquid and external impact absorption performance of the first and second conductive resin layers 131*b* and 132*b* may not be used. Therefore, reliability of the ceramic body 110 may be degraded.

The greater a longest length of each of the first and second conductive resin layers 131*b* and 132*b* in a length direction, the greater the overall thickness of the first and second conductive resin layers 131*b* and 132*b*. The longest length of the first conductive resin layer 131*b* in the length direction may mean a longest distance, in the length direction, between two selected from any planes which are tangent to or intersected by the first conductive resin layer 131*b* and which are perpendicular to the length direction. The longest length of the second conductive resin layer 132*b* in the length direction may mean a longest distance, in the length direction, between two selected from any planes which are tangent to or intersected by the second conductive resin layer 132*b* and which are perpendicular to the length direction. For example, when each of the first and second conductive resin layers 131*b* and 132*b* has a longest length, in the length direction, which is relatively greater, they may be prevented from being discontinued on the rounded corner 140.

Accordingly, when a ratio of an average BWb of the respective longest lengths of the first and second conductive resin layers 131b and 132b to the radius RC of the rounded corner 140 is optimized, the multilayer ceramic electronic component may efficiently disperse stress from the rounded corner 140 to improve reliability (for example, prevention of humidity/plating liquid permeation, external impact absorption performance, prevention of external electrode faulty, and the like) of the ceramic body while 110 having improved strength.

Table (1) shows flexural strength and reliability depending on BWb and RC. The flexural strength refers to whether cracking occurs when a multilayer ceramic electronic component is bent by a predetermined length by applying force in a thickness direction to a center of a top surface and/or a bottom surface of the multilayer ceramic electronic component. In Table (1), the predetermined length is 5 mm, and refers to displacement of the center of the top surface and/or the bottom surface of the multilayer ceramic electronic component in the thickness direction.

TABLE (1)

| Sample order | BWb (μm) | RC (μm) | BWb/RC | Flexural Strength | Reliability |
|---|---|---|---|---|---|
| 1 | 100 | 10 | 10.0 | OK | OK |
| 2 | 100 | 30 | 3.3 | OK | NG |
| 3 | 100 | 50 | 2.0 | OK | NG |
| 4 | 200 | 10 | 20.0 | OK | OK |
| 5 | 200 | 30 | 6.7 | OK | OK |
| 6 | 200 | 50 | 4.0 | OK | OK |
| 7 | 300 | 10 | 30.0 | NG | OK |
| 8 | 300 | 30 | 10.0 | OK | OK |
| 9 | 300 | 50 | 6.0 | OK | OK |
| 10 | 400 | 10 | 40.0 | NG | OK |
| 11 | 400 | 30 | 13.3 | OK | OK |
| 12 | 400 | 50 | 8.0 | OK | OK |
| 13 | 600 | 10 | 60.0 | NG | OK |
| 14 | 600 | 30 | 20.0 | OK | OK |
| 15 | 600 | 50 | 12.0 | OK | OK |

Referring to Table (1), the multilayer ceramic electronic component may have improved flexural strength and improved reliability when BWb/RC is 4 or more to 22 or less, or is 4 or more to 20 or less.

An average of the respective longest lengths of the first and second base electrode layers 131a and 132a in the length direction is denoted by BWa, and BWa/Rc may be greater than 2 and less than BWb/RC. The longest length of the first base electrode layer 131a in the length direction may mean a longest distance, in the length direction, between two selected from any planes which are tangent to or intersected by the first base electrode layer 131a and which are perpendicular to the length direction. The longest length of the second base electrode layer 132a in the length direction may mean a longest distance, in the length direction, between two selected from any planes which are tangent to or intersected by the second base electrode layer 132a and which are perpendicular to the length direction.

For example, the first and second base electrode layers 131a and 132a may extend in the length direction to be longer than a diameter of the rounded corner 140 and shorter than the first and second conductive resin layers 131b and 132b.

Accordingly, since the first and second base electrode layers 131a and 132a may stably cover the rounded corner 140, the reliability of the ceramic body 110 may be further improved. In addition, since the multilayer ceramic electronic component may further concentrate rigidity of the conductive metal of the first and second base electrode layers 131a and 132a on a top surface and/or a bottom surface of the ceramic body 110, the multilayer ceramic electronic component may have further improved strength.

On the other hand, BWb may be greater than or equal to BWa+RC. For example, a distance between an edge of the first and second base electrode layers 131a and 132a in the length direction and an edge of the first and second conductive resin layers 131b and 132b in the length direction may be greater than or equal to the radius of the rounded corner 140.

Accordingly, the first and second external electrodes 131 and 132 may efficiently suppress cracking starting from edges of the first and second base electrode layers 131a and 132a in the length direction. Additionally, the first and second external electrodes 131 and 132 may further balance the external impact absorption performance of the first and second conductive resin layers 131b and 132b and the rigidity of the first and second base electrode layers 131a and 132a to further improve the strength of the multilayer ceramic electronic component.

Figure 3C:
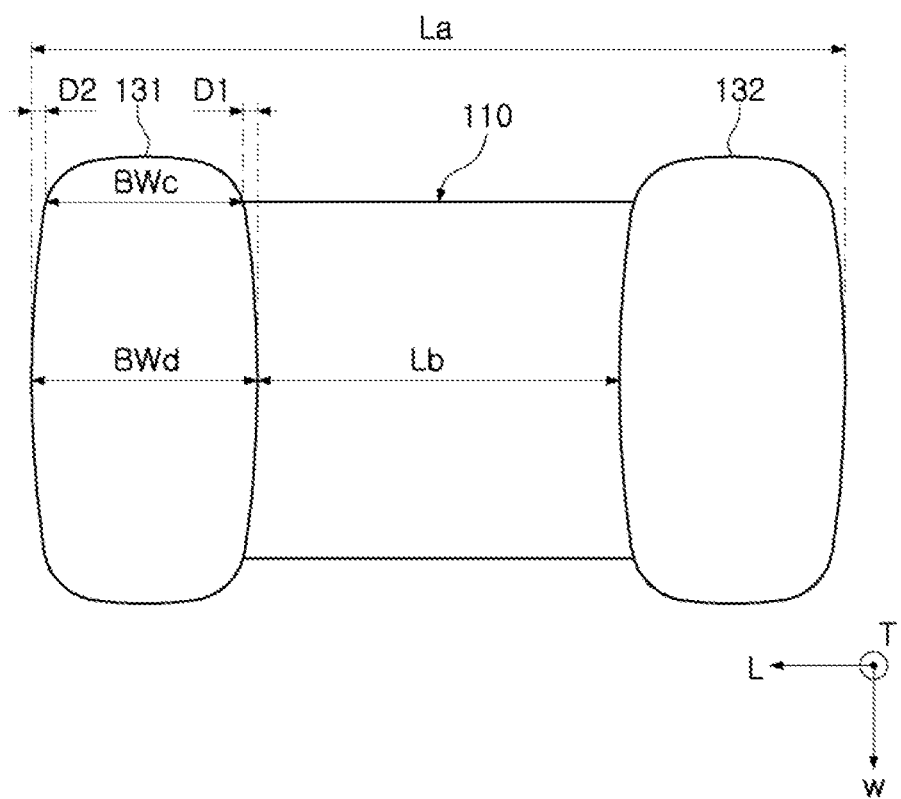
FIG. 3C is a plan view illustrating an extension of an external electrode, in a length direction, of a multilayer ceramic electronic component according to an exemplary embodiment in the present disclosure.

FIG. 3C is a plan view illustrating an extension of an external electrode, in a length direction, of a multilayer ceramic electronic component according to an exemplary embodiment in the present disclosure.

Referring to FIG. 3C, the first and second external electrode 131 and 132 may extend along a surface of the ceramic body 110 in a length direction.

Accordingly, a volume ratio of a conductive metal to an entire volume of the multilayer ceramic electronic component according to an exemplary embodiment may be increased. Since the conductive metal of the first and second external electrodes 131 and 132 may have strength greater than strength of a typical ceramic component, the multilayer ceramic electronic component may have much greater strength according to the extension of the first and second external electrodes 131 and 132 in the length direction.

An external impact (for example, bending, tension or the like) may be further concentrated on a top surface and/or a bottom surface of the multilayer ceramic electronic component. Since rigidity may be further concentrated on the top surface and/or the bottom surface according to the extension of the first and second external electrodes 131 and 132 in the length direction, the multilayer ceramic electronic component may efficiently cope with the external impact and may have further improved strength.

A longest length from the first external electrode 131 to the second external electrode 132 in the length direction is denoted by La, a shortest length from the first external electrode 131 to the second external electrode 132 in the length direction is denoted by Lb, and an average of the respective longest lengths of the first and second external electrodes 131 and 132 is denoted by BWd. The longest length La from the first external electrode 131 to the second external electrode 132 in the length direction may mean a longest distance, in the length direction, between two selected from any planes, one tangent to or intersected by the first electrode 131 and perpendicular to the length direction and the other tangent to or intersected by the second electrode 132 and perpendicular to the length direction. The shortest length Lb from the first external electrode 131 to the second external electrode 132 in the length direction may mean a shortest distance, in the length direction, between two selected from any planes, one tangent to or intersected by the first electrode 131 and perpendicular to the length direction and the other tangent to or intersected by the second electrode 132 and perpendicular to the length direction. The longest length of the first electrode 131 in the length direction may mean a longest distance, in the length direction, between two selected from any planes which are tangent to or intersected by the first electrode 131 and which are perpendicular to the length direction. The longest length of the second electrode 132 in the length direction may mean a longest distance, in the length direction, between two selected from any planes which are tangent to or intersected by the second electrode 132 and which are perpendicular to the length direction.

Table (2) shows flexural strength depending on La, Lb, and BWd. In Table (2), a determination criterion of the flexural strength is 6 mm, and the other experimental conditions and determination conditions are the same as those in Table (1).

TABLE (2)

| Sample Order | La (mm) | Lb (mm) | BWd (mm) | Lb/La | Flexural Strength | Determination |
|---|---|---|---|---|---|---|
| 1 | 3.2 | 2.8 | 0.20 | 0.88 | 10/20 | NG |
| 2 | 3.2 | 2.7 | 0.25 | 0.84 | 9/20 | NG |
| 3 | 3.2 | 2.6 | 0.30 | 0.81 | 7/20 | NG |
| 4 | 3.2 | 2.5 | 0.35 | 0.78 | 6/20 | NG |
| 5 | 3.2 | 2.4 | 0.40 | 0.75 | 4/20 | NG |
| 6 | 3.2 | 2.3 | 0.45 | 0.72 | 3/20 | NG |
| 7 | 3.2 | 2.2 | 0.50 | 0.69 | 2/20 | NG |
| 8 | 3.2 | 2.1 | 0.55 | 0.66 | 1/20 | NG |
| 9 | 3.2 | 2.0 | 0.60 | 0.63 | 1/20 | NG |
| 10 | 3.2 | 1.9 | 0.65 | 0.59 | 0/20 | OK |
| 11 | 3.2 | 1.8 | 0.70 | 0.56 | 0/20 | OK |
| 12 | 3.2 | 1.7 | 0.75 | 0.53 | 0/20 | OK |
| 13 | 3.2 | 1.6 | 0.80 | 0.50 | 0/20 | OK |

Referring to Table (2), when Lb/La is 0.6 or less, cracking did not occur in 20 flexural strength measurements. Accordingly, the multilayer ceramic electronic component may include the first and second external electrodes 131 and 132, in which Lb/La is 0.6 or less, to significantly improve the flexural strength.

BWb may be [(La−Lb)/2]−RC or more to (La−Lb)/2 or less. For example, a distance between an edge of the first and second conductive resin layers 131b and 132b in the length direction and an edge of the first and second external electrodes 131 and 132 in the length direction may be RC or less. Accordingly, since the first and second external electrodes 131 and 132 may more efficiently use the external impact absorption performance of the conductive resin layers 131b and 132b, the first and second external electrodes 131 and 132 may further improve the strength of the multilayer ceramic electronic component.

An average D1 of differentials in internal lengths of BWc and BWd of each of the first and second external electrodes 131 and 132 in the length direction, an average D2 of differentials in external lengths of BWc and BWd of each of the first and second external electrodes 131 and 132 in the length direction, and an average BWd of the longest lengths of the respective first and second external electrodes 131 and 132 in the length direction are not limited.

Figure 4A:
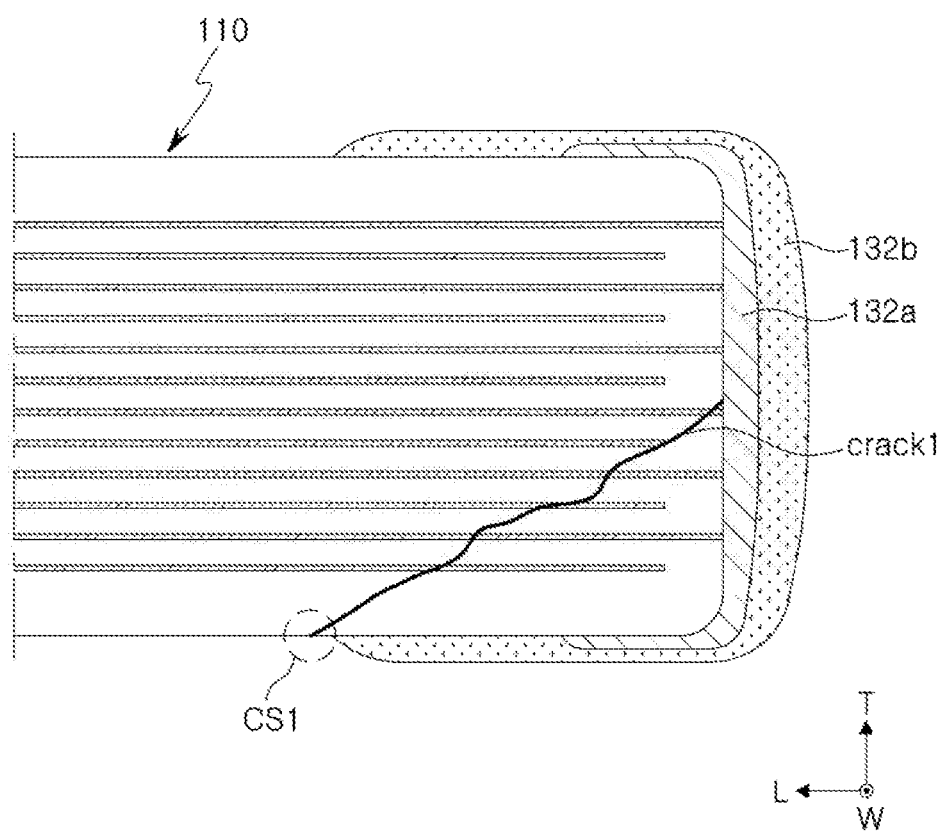
FIGS. 4A to 4C illustrate cracking in connection with strength of a multilayer ceramic electronic component.
Figure 4B:
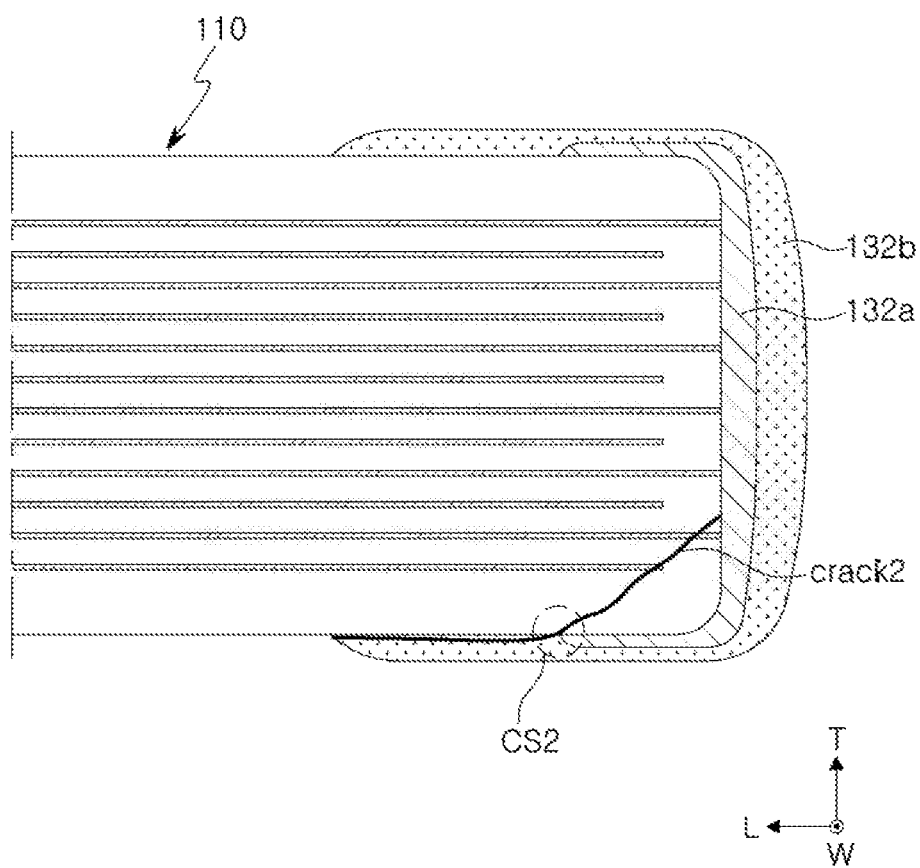
Figure 4C:
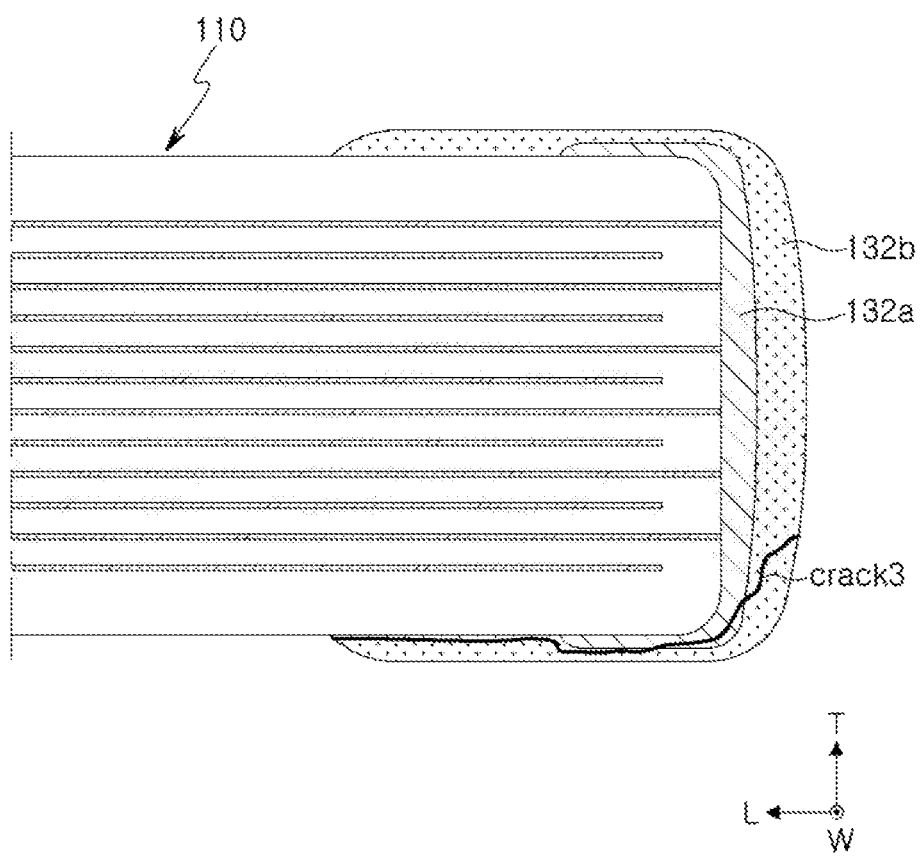

FIGS. 4A to 4C illustrate cracking in connection with strength of a multilayer ceramic electronic component.

Referring to FIG. 4A, a start point CS1 of a first type of cracking crack1 may be adjacent to an edge of a conductive resin layer in a length direction.

Referring to FIG. 4B, a start point CS2 of a second type of cracking crack2 may be adjacent to an edge of a base electrode layer in a length direction.

Referring to FIG. 4C, a third type of cracking crack3 may occur in a conductive resin layer.

A multilayer ceramic electronic component according to an exemplary embodiment may reduce a frequency of the first, second, and third types of cracking crack1, crack2, and crack3 occurring, and may relatively significantly reduce a frequency of the second type of cracking crack2 occurring.

As described above, a multilayer ceramic electronic component according to an exemplary embodiment may improve reliability (for example, prevention of humidity/plating liquid permeation, external impact absorption performance, prevention of external electrode faulty, and the like) of a rounded corner of a ceramic body while having improved strength.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
    a ceramic body having at least one rounded corner, and including dielectric layers and first and second internal electrodes laminated with respective dielectric layers interposed therebetween to be exposed to a first external surface and a second external surface of the ceramic body; and
    first and second external electrodes, disposed on external surfaces of the ceramic body and electrically connected to corresponding internal electrodes among the first and second internal electrodes, respectively, extending to a surface of the ceramic body in a thickness direction,
    wherein the first and second external electrodes include first and second base electrode layers, each having at least a portion in contact with first and second external surfaces of the ceramic body, first and second conductive resin layers covering the first and second base electrode layers, respectively, and first and second plating layers covering the first and second conductive resin layers, respectively,
    an average of respective longest lengths of the first and second conductive resin layers in a length direction is denoted by BWb, a radius of the rounded corner is denoted by RC, and BWb/RC is 4 or more to 22 or less,
    a longest length from the first external electrode to the second external electrode in the length direction is denoted by La,
    a shortest length from the first external electrode to the second external electrode in the length direction is denoted by Lb,
    Lb/La is greater than 0 to 0.6 or less, and
    BWb is greater than or equal to [(La−Lb)/2]−RC and less than (La−Lb)/2.

2. The multilayer ceramic electronic component of claim 1, wherein an average of respective longest lengths of the first and second base electrode layers in the length direction is denoted by BWa, and BWa/RC is greater than 2 and less than BWb/RC.

3. The multilayer ceramic electronic component of claim 2, wherein BWb is greater than or equal to BWa+RC.

4. The multilayer ceramic electronic component of claim 1, wherein RC is 10 micrometers (μm) or more to 50 μm or less, and BWb is 100 μm or more to 600 μm or less.

5. The multilayer ceramic electronic component of claim 1, wherein a distance between the first and second internal electrodes is greater than or equal to twice an average of respective thicknesses of the first and second internal electrodes.

6. The multilayer ceramic electronic component of claim 1, wherein BWb/RC is 4 or more to 20 or less.

* * * * *